United States Patent [19]
Iwase

[11] Patent Number: 5,392,233
[45] Date of Patent: Feb. 21, 1995

[54] READ ONLY MEMORY CAPABLE OF REALIZING HIGH-SPEED READ OPERATION

[75] Inventor: Taira Iwase, Kawasaki, Japan

[73] Assignee: Kabushiki Kaisha Toshiba, Kawasaki, Japan

[21] Appl. No.: 991,642

[22] Filed: Dec. 16, 1992

[30] Foreign Application Priority Data

Dec. 16, 1991 [JP] Japan .................................. 3-332071

[51] Int. Cl.$^6$ ......................... G11C 17/00; G11C 11/34
[52] U.S. Cl. ..................................... 365/104; 365/185
[58] Field of Search ......................... 365/104, 185, 103

[56] References Cited

U.S. PATENT DOCUMENTS 5,117,389  5/1992  Yiu ..................................... 365/104
5,202,848  4/1993  Nakagawara ...................... 365/104

OTHER PUBLICATIONS

"16Mb ROM Design Using Bank Select Architecture", M. Okada, et al., Symposium VLSI Circuits, Aug. 1988.

Primary Examiner—William L. Sikes
Assistant Examiner—Tiep H. Nguyen
Attorney, Agent, or Firm—foley & Lardner

[57] ABSTRACT

A mask read only memory (ROM) has a small chip size and realizes high-speed operation and a large capacity by reducing a wiring capacity of a main bit line and a virtual ground line. Between the main bit line and the virtual ground line are three bit lines, and between the main bit line and the virtual ground line are formed two columns of memory cell transistor columns in the direction of the word line, Furthermore, the main bit line and the virtual ground line do not have zig-zag wiring, and can be configured so that the lines are in parallel straight lines so that the connections between the bit lines and the main bit lines, and between the bit lines and the virtual ground lines can be suitably made or broken by a drive current supplied via a selector line and using transistors as gates, to therefore enable the selection of a required memory cell transistor column by on-off control, 9 Claims, 8 Drawing Sheets

READ ONLY MEMORY CAPABLE OF REALIZING HIGH-SPEED READ OPERATION

BACKGROUND OF THE INVENTION

The present invention relates to a mask ROM (Read Only Memory) and in particular, to a NOR-type mask ROM.

One type of large-capacity mask ROM memory cell is a NOR-type of mask ROM in which a source and a drain of a memory cell are formed by an N+ diffusion layer, and a word line is arranged so as to intersect this N+ diffusion layer. A bit line is provided so as to intersect with this word line. The application of a read current to this intersecting word line and bit line enables a required memory cell to be selected. In this NOR-type mask ROM, one main bit line and one ground line are provided in parallel to select one of two adjacent columns of memory cells, and between them are provided two bit lines for selecting one of the two memory cells. When the ground line is fixedly provided, a dead path occurs in the direction of the width of the bit line of the entire memory and so there has been proposed a technique to provide this ground line as a so-called virtual ground line. More specifically, the virtual ground line is a ground line which is configured so that it is in connection with only a source side of a selected cell when that cell is selected.

FIGS. 1 and 2 show respectively, a circuit configuration of a memory cell array of a mask ROM provided with the virtual ground line having such a configuration, and a plan view of a memory cell array.

In FIG. 1, a bit line 1 which is arranged in the up and down direction is formed by an N+ diffusion layer, and a word line 2 which is arranged to the left and right of it are formed by polycide. The bit line 1 and the word line 2 are arranged so as to intersect, and a source and drain region of the MOS transistor is formed at the intersecting portion, and a flat cell 3 which forms a channel of the MOS transistor has a NOR-type configuration. The configuration is such that a means such as differences in the amounts of diffused impurities to the channel is used for the flat cell 3 to conduct or not conduct by a required gate voltage which corresponds to the information bit which the cell is to hold. The flat cell has the N+ diffusion layer as the bit line and so in order to increase the connection capacitance and the resistance, a bank selector circuit configuration, not shown in the figure, is used so that a large reduction in the two makes use of the NOR type which is characteristic of the flat cell and enables high-speed read. Each bank is configured from an even-numbered bank selector transistor 4 and an odd-numbered bank selector transistor 5 which are each connected to each end of the bit line 1, and 16 memory cells which have the 16 word lines $WL_0$–$WL_{15}$ as the gate electrodes, with the memory array being divided into 256 banks in the direction of the bit line 1. The bit line 1 is connected to a main bit line 6 which is formed of aluminum (hereinafter abbreviated to A1) and via the even-numbered bank selector transistor 4 and the odd-numbered bank selector transistor 5. The lower end portion of the main bit line 6 is connected to a sense amplifier 14 via a column selector transistor 13 which is controlled by a column selector line CS. A virtual ground line 7 is also formed by A1, and is connected to the source of the memory cell transistor 3 via the even-numbered bank selector transistor 4 and the odd-numbered bank selector transistor 5. The lower end portion of the virtual ground line 7 is connected via a virtual ground selector transistor 15 which is controlled by a virtual ground selector line VS and the column selector transistor 13. The main bit line 6 and the virtual ground line 7 are arranged so that they are adjacent. The memory cell relates to either the even-numbered columns 8 or the odd-numbered columns 9 and it is possible to select either the even-numbered columns 8 or the odd-numbered columns 9 by switching the even-numbered bank selector transistor 4 and the odd-numbered bank selector transistor 5 at both ends of the bit line 1.

For example, a read operation for even-numbered columns involves both an even-numbered column-bank selector line 10 and one word line such as the word line $WL_{15}$, becoming the "Hi" level when they are selected, and the source and the drain of a memory cell 3a being connected to the main bit line 6 and the virtual ground line 7 of A1. At this time, an odd-numbered column bank selector line 11 becomes the "Lo" level and the odd-numbered bank selector transistor 5 turns off. A "Hi" level is also impressed to an odd-numbered column memory cell 3b by the word line $WL_{15}$ but across the source and the drain of the odd-numbered column memory cell is shorted by the even-numbered bank selector transistor 4 which is in the on status, the memory cell 3b is off.

Accordingly, when the even-numbered column bank selector line 10 of bank i, and the word line $WL_{15}$ are selected, the presence or absence of a current passing through the memory cell 3a reads the contents stored in the memory cell 3a to the sense amplifier 14. Read operations of the memory cells of odd-numbered columns are performed in a similar manner.

As has been described above, the main bit line 6 and the virtual ground line 7 are formed of A1 wiring and in addition to connecting the A1-N+ diffused connection 12 arranged so as to perform selection of even-numbered columns and odd-numbered columns, also performs zig-zag wiring in the direction of the columns. The A1 line pitch is twice that of the N+ diffusion bit line pitch, and the configuration is such that it is possible to greatly reduce the coupling noise and shorting between the A1 and so ensure sufficient space between the A1.

However, with such a conventional configuration, the memory cell columns formed between the main bit line and the virtual ground line are ½ column, 1 column and ½ by the two bit lines. The memory cells are one each in the direction of the word line and so the chip size increases by this portion. This influence increases for the larger the number of divisions of the memory cell array, and is a problem for large-capacity mask ROM. In addition, since the A1 main bit line and the virtual ground line are bent in a zig-zag to select the even-numbered columns and the odd-numbered columns, the wiring length becomes longer by this portion to the disadvantage of high-speed operation. The zig-zag configuration of the main bit line and the virtual ground line places restrictions on the configuration due to the principle of operation of mask ROM.

SUMMARY OF THE INVENTION

An object of the present invention is to provide a ROM memory which has a small chip size yet realizes a large capacity and high-speed operation by avoiding a zig-zag shape for the main bit line and the virtual ground line.

In order to achieve the above objective, inside a storage region of the ROM memory according to the present invention are provided a plural number of bit lines which are repeatedly arranged in a single unit group of four parallel lines; a plural number of word lines which are arranged so as to intersect the bit lines; a memory cell transistor group having a portion of intersection of the bit line and the word line being made a source region and a drain region, and a portion sandwiched between the intersection portion being made a channel region; a plural number of main bit lines which connect one end of a second bit line and an end on a forward direction side of first and third bit lines of the unit group, and which are connected via a transistor and arranged in a straight line in a direction of the bit line; and a plural number of virtual ground line which connects one end of a fourth bit line and an end on a reverse direction side of a third bit line of said unit group, and an end of a reverse direction side of a first bit line of a next unit group via a transistor.

By this configuration, there are three bit lines between the main bit line and the virtual ground line and so two-memory transistor columns are formed in the direction of the word line and between a main bit line and a virtual bit line. Because of this, there is no zig-zag wiring for the main bit line and the virtual ground line, and it is possible to select a required memory cell column by suitably controlling the on and off of a transistor which makes and breaks the connection between the bit line and the main bit line, or the bit line and the ground line.

According to the present invention as described above, it is not necessary to skip one memory cell for selection of even-numbered and odd-numbered memory cell columns and form zig-zag wiring between the main bit lines and virtual ground lines, and the wiring between the main bit line and the virtual ground line can be wired straight. With this configuration it is possible to make the chip size smaller as there is no dead space in the cell array. In addition, since it is not necessary to bend the wiring into a zig-zag shape, it is possible for the wiring capacity to be minimum, and for the area of the N+ dispersion layer of the connection portion of the bit line to be made small, this being desirable for the high-speed read operations.

BRIEF DESCRIPTION OF THE DRAWINGS

In the appended figures.

DETAILED DESCRIPTION OF THE PREFERRED EMBODIMENTS

Figure 1:
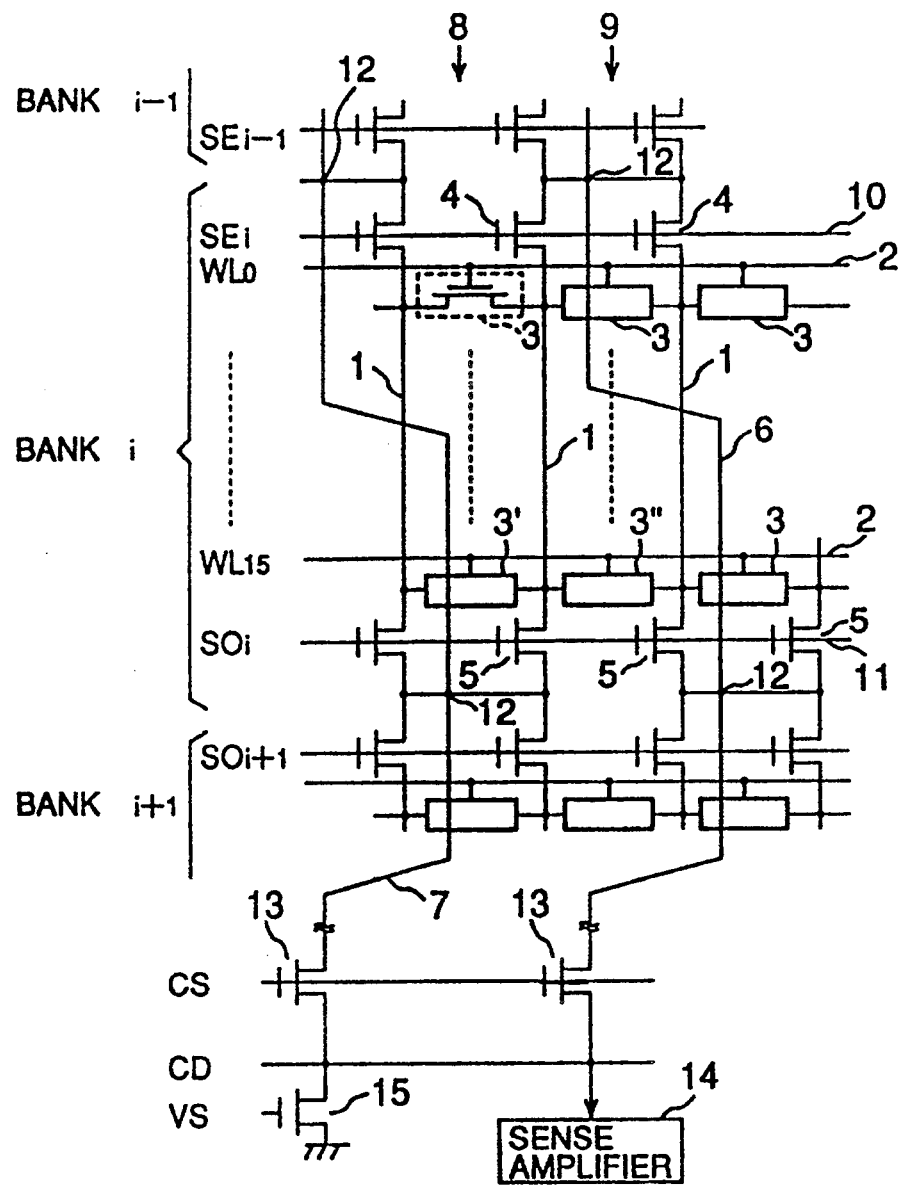
FIG. 1 is a circuit diagram showing an equivalent circuit of a ROM according to a conventional example.
Figure 2:
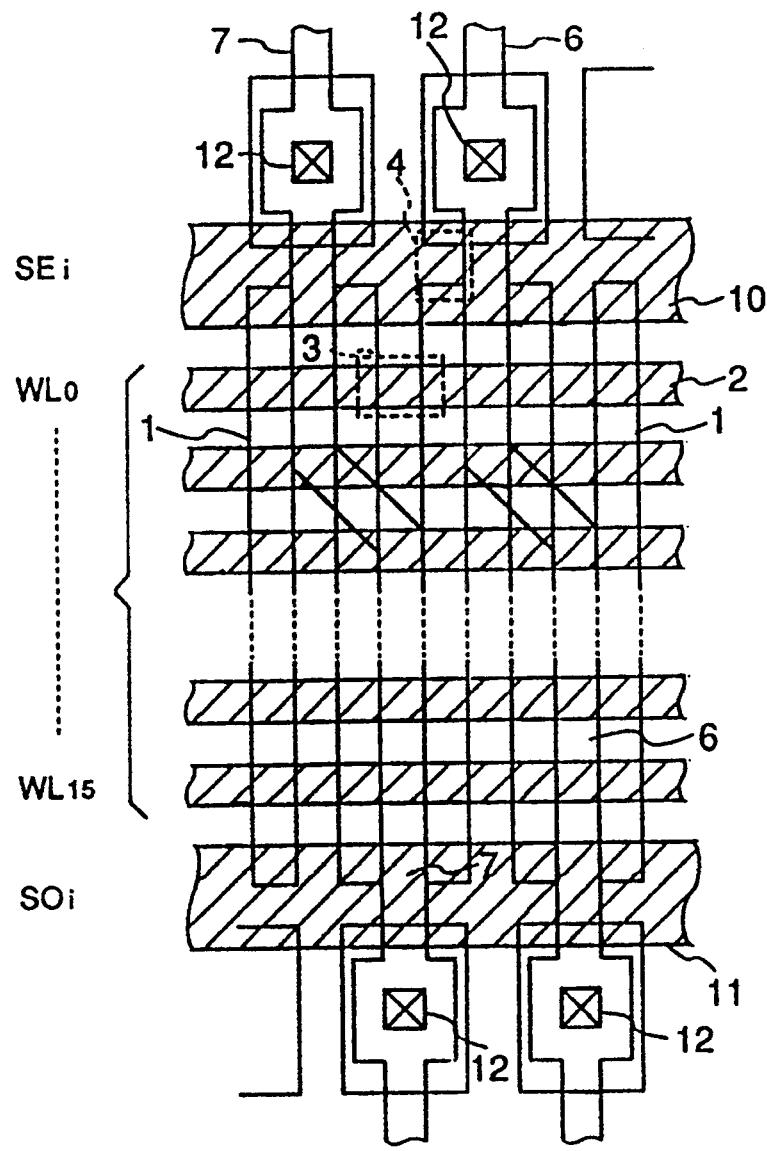
FIG. 2 is a plane view showing an example of the wiring structure of a memory cell region for the case when the equivalent circuit shown in FIG. 1 is formed as an IC circuit.
Figure 3:
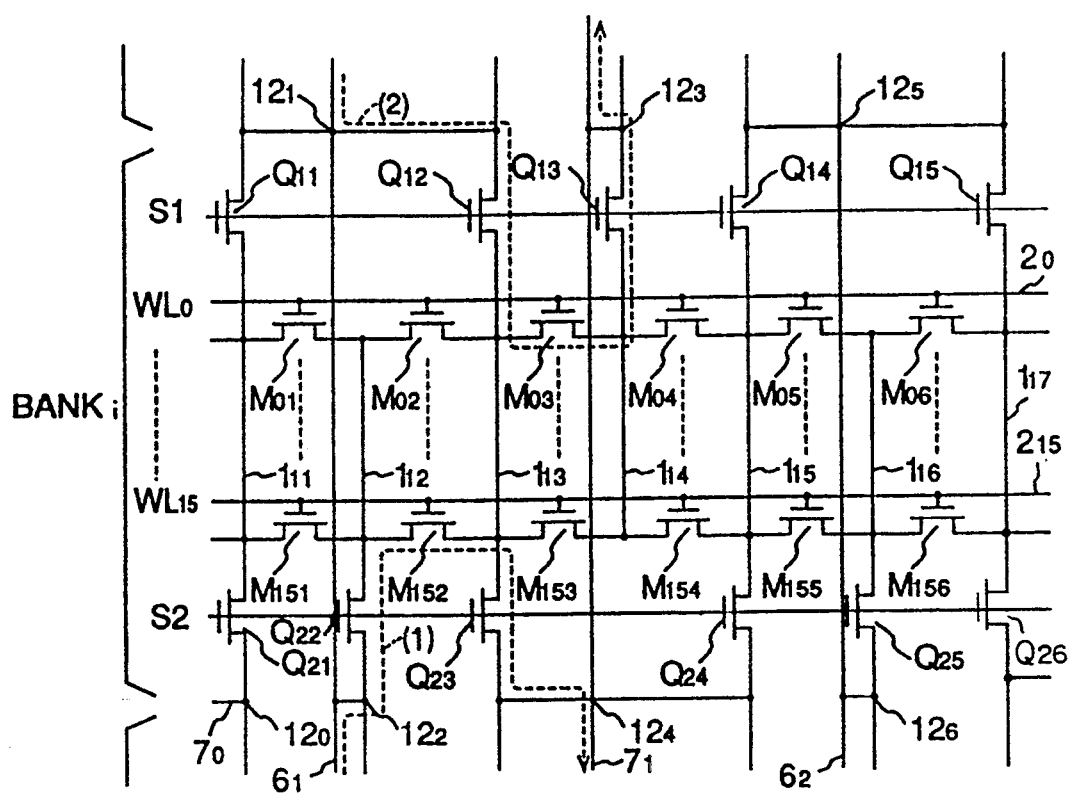
FIG. 3 is a circuit diagram showing an equivalent circuit of a ROM memory according to a first embodiment of the present invention.

FIG. 3 shows a mask ROM according to a first embodiment of the present invention, and shows the equivalent circuit for the portion corresponding to the 1 bank of the ROM. In the equivalent circuit shown in FIG. 3, those portions which correspond to the conventional example shown in FIG. 1 are shown with the same reference numerals, with the disclosure for the circuit of the shared portions being omitted.

In FIG. 3, main bit lines $6_1$, $6_2$, ..., and virtual ground lines $7_0$, $7_1$, ... which cross a plural number of banks are arranged so as to intersect. Between an upper connection point $12_1$ of the main bit line $6_1$ and a lower connection point $12_0$ of a virtual ground line $7_0$ is connected a bit line $1_{11}$ via column selector transistors $Q_{11}$ and $Q_{21}$. Between the upper connection point $12_1$ of the main bit line $6_1$ and lower connection point $12_4$ of a virtual ground line $7_1$ is connected a bit line $1_{13}$ via the column selector transistors $Q_{12}$ and $Q_{23}$. Between the lower connection point $12_4$ of the virtual ground line $7_1$ and an upper connection point $12_5$ of the main bit line $6_2$ is connected a bit line $1_{15}$ via column selector transistors $Q_{14}$ and $Q_{24}$. Between the bit line $1_{11}$ and the bit line $1_{13}$ are connected MOS transistors $M_{01}$ and $M_{02}$ in series, and the point of connection between both transistors and a lower connection point $12_2$ of the main bit line $6_1$ are connected via the column selector transistor $Q_{22}$. Between a bit line $1_{13}$ and a bit line $1_{15}$ are connected MOS transistors $M_{153}$ and $M_{154}$ in series, and the point of connection between the two transistors and an upper connection point $12_3$ of the virtual ground line $7_1$ are connected via the column selector transistor $Q_{13}$. Between a bit line $1_{15}$ and a bit line $1_{17}$ are connected a MOS transistors $M_{05}$ and $M_{06}$ in series, and the point of connection of both transistors and a lower connection point $12_6$ of the main bit line $6_2$ are connected in series via a column selector transistor $Q_{25}$. Each of the gates of the column selector transistors $Q_{11}$–$Q_{15}$ are connected to the selector line S1 and are on-off controlled. Each of the gates of the column selector transistors $Q_{21}$–$Q_{26}$ are connected to a selector line S2 and are on-off controlled. The bit lines $1_{11}$–$1_{14}$ configure one unit group, while the bit lines $1_{15}$–$1_{18}$ configure the next unit group. Wiring in such a vertical direction is repeatedly arranged in accordance with the memory capacity.

Word lines $WL_0$–$WL_{15}$ are arranged in a number which corresponds to the storage capacity of the bank i and so as to intersect the bit lines $1_{11}$–$1_{17}$. In the region in which the bit lines and word lines intersect are arranged the MOS transistors $M_{01}$–$M_{156}$ as memory cells. More specifically, between the bit lines $1_{11}$ and $1_{12}$, are connected in parallel the transistors $M_{01}$, $M_{11}$, $M_{21}$, ..., $M_{151}$. Between the bit lines $1_{13}$ and $1_{14}$ are connected in parallel the transistors $M_{03}$, $M_{13}$, $M_{23}$, ..., $M_{153}$. In the same manner, the transistors $M_{04}$–$M_{156}$ are mutually connected across the bit lines $1_{14}$–$1_{17}$. Each of the gates of the first row of transistors $M_{01}$–$M_{06}$ of the transistors $M_{01}$–$M_{156}$ is connected to the word line $WL_0$. The word line $WL_1$ is connected to each of the gates of the transistor group of the second line. In the same manner, the word lines $WL_2$–$W_{15}$ are connected to each of the gates of the transistor groups of the third line—sixteenth line. The memory cells 3 formed by these transistors have a NOR-type configuration, and either transistor conducting or non-conducting is set with respect to a required voltage which is impressed to the gate in accordance with the program information. The other portions of the configuration are the same as those in the conventional configuration and so the description is omitted here.

In this manner, each of the main bit lines are connected to three bit lines by the upper and lower connection points and to each of the virtual ground lines are connected three bit lines by the upper and lower connection points. In addition, the lower connection point of the virtual ground line and the upper connection point of the main bit line is connected by a bit line. This is to say that each other bit line $1_{11}$, $1_{13}$, $1_{15}$, ... connects between the upper connection point $12_1$ of the main bit line and the lower connection point $12_0$ of the virtual ground line, between the lower connection point $12_4$ of the virtual ground line and the upper connection point $12_1$ of the main bit line, and between the upper connection point $12_5$ of the main bit line and the lower connection point $12_4$ of the virtual ground line. In addition, the bit lines $1_{12}$, $1_{16}$, ... which are closest to the main bit line are connected to the main bit lines $6_1$, $6_2$, .... Also, the bit lines $1_{10}$, $1_{14}$, ... which are closest to the virtual ground line are connected to the virtual ground lines $7_0$, $7$, ... .

The following is a description of the read operation for reading information from the memory cell. When the memory cells $M_{01}$–$M_{151}$ and $M_{02}$–$M_{152}$ in the left two columns are selected, the selection line $S_1$ is low and the selection line $S_2$ is high. When the cells $M_{01}$–$M_{151}$ in the first column are read, the main bit line $6_1$ is high and the virtual ground line $7_0$ is low, thereby supplying a voltage between the bit lines $1_{12}$ and $1_{11}$. When any of the word lines $WL_0$–$WL_{15}$ becomes high, memory cells $M_{01}$–$M_{151}$ are selected corresponding to the high word line.

When the memory cells in the right two columns are selected, the selection line $S_1$ is high and the selection line $S_2$ is low. When the cells $M_{03}$–$M_{153}$ in the third column are read, the main bit line $6_1$ is high and the virtual ground line $7_1$ is low, thereby supplying a voltage between the bit lines $1_{13}$ and $1_{14}$. When any of word lines $WL_0$–$WL_{15}$ becomes high, any of the memory cells $M_{01}$–$M_{151}$ are selected corresponding to the high word line. When the cells $M_{04}$–$M_{154}$ in the fourth column are read, the main bit line $6_2$ is high and the virtual ground line $7_1$ is low, thereby supplying a voltage between the bit lines $1_{15}$ and $1_{14}$. When any of the word lines $WL_0$–$WL_{15}$ become high, memory cells $M_{01}$–$M_{151}$ are selected corresponding to the high word line. In the configuration described above, one of the plural number of virtual ground lines, such as virtual ground line $7_1$ for example, is set to the "Lo" level. The selector line $S_1$ is made the "Lo" level and the selector line $S_2$ is made the "Hi" level. One of the plural number of word lines, such as the word line $WL_{15}$, is set to the "Hi" level.

If this is done, then the selector transistor $Q_{11}$–$Q_{15}$ become off, and the selector transistors $Q_{21}$–$Q_{25}$ become on. If the transistors $Q_{22}$ and $Q_{23}$ are conducting, then a voltage is impressed across the bit lines $1_{12}$ and $1_{13}$. In addition, the "Hi" level is impressed to the gates of the transistors $M_{151}$–$M_{156}$. Accordingly, only transistor $M_{152}$ has the voltage impressed across the source and the drain, and across the gate and the source. In this manner, if the selected memory cell $M_{152}$ has the normal threshold voltage Vth (approx. 1 V), then a current flows from the main bit line $6_1$ to the virtual ground line $7_1$ by the route (1) shown in the figure. No current will flow if the threshold voltage Vth of the selected memory cell $M_{152}$ is high (7–8 V). This current is detected by the sense amplifier not shown in the figure, and is converted to the logical level.

In addition, when the data of the memory cell $M_{03}$ is read, the virtual ground line $7_1$ of the plural number of virtual ground lines is set to the "Lo" level. The selector line S1 is made the "Hi" level and the selector line S2 is made the "Lo" level. Only the word line $WL_{15}$ is at the "Hi" level. If this selected memory cell $M_{03}$ is at the normal threshold voltage Vth (approx. 1 V), then a current flows from the main bit line to the virtual bit line by the route (2) shown in the figure. No current flows if the threshold voltage Vth of the selected memory cell is high (7–8 V). It is possible to read data from a required memory cell by this operation.

Figure 4:
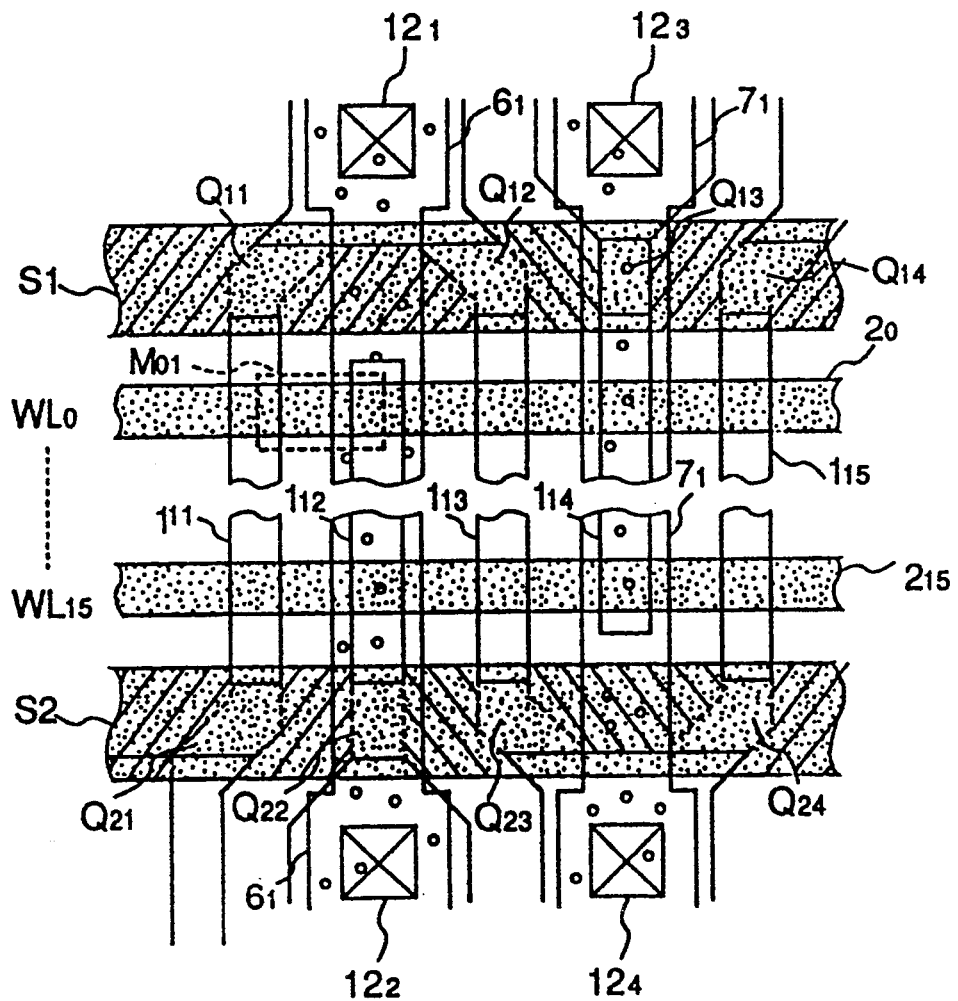
FIG. 4 is a plane view showing an example of the wiring structure of a memory cell region for the case when the equivalent circuit according to a first embodiment and shown in FIG. 3 is formed as an IC circuit.

FIG. 4 shows a plan view of a memory cell for the case when the equivalent circuit described above is formed as an IC circuit, with corresponding portions being indicated with corresponding reference numerals.

The bit lines $1_{11}$–$1_{15}$ configured fin the direction of the columns are formed by an N+ diffusion layer on the surface of the substrate. The word lines $2_0$–$2_{15}$ configured in the direction of the rows are formed by polycide. A channel of a MOS transistor is formed between this intersecting portion and the source region and the drain region of the MOS transistor at the intersection portion of the bit lines and the word lines. For example, it is possible to use the amount of diffusion of impurity in the channel to set the threshold voltage Vth. The bit lines $1_{11}$ and $1_{13}$ are connected to the main bit line $6_1$ of A1 by the contact hole $12_1$ and via the transistors $Q_{11}$ and $Q_{12}$. In addition, the bit line $1_{12}$ is connected to the main bit line $6_1$ by the contact hole $12_2$ and via the transistor $Q_{22}$. The bit lines $1_{13}$ and $1_{15}$ are connected to the virtual ground line $7_1$ of A1, by the contact hole $12_4$ and via the transistors $Q_{23}$ and $Q_{24}$. In addition, the bit line $1_{14}$ is connected to the virtual ground line $7_1$ by the contact hole $12_3$ and via the transistor $Q_{13}$. For example, a channel cut region is formed by the injection of impurity ions to the region shown by the shading in the selector lines S1 and S2 formed by polycide.

As is clear from FIG. 4, the main bit line $6_1$ and the virtual ground line $7_1$ can be arranged in a line and so the wiring capacitance of the A1 becomes smaller, and the N+ contact region of the bit line becomes small and so this is advantageous for high-speed read.

Figure 5:
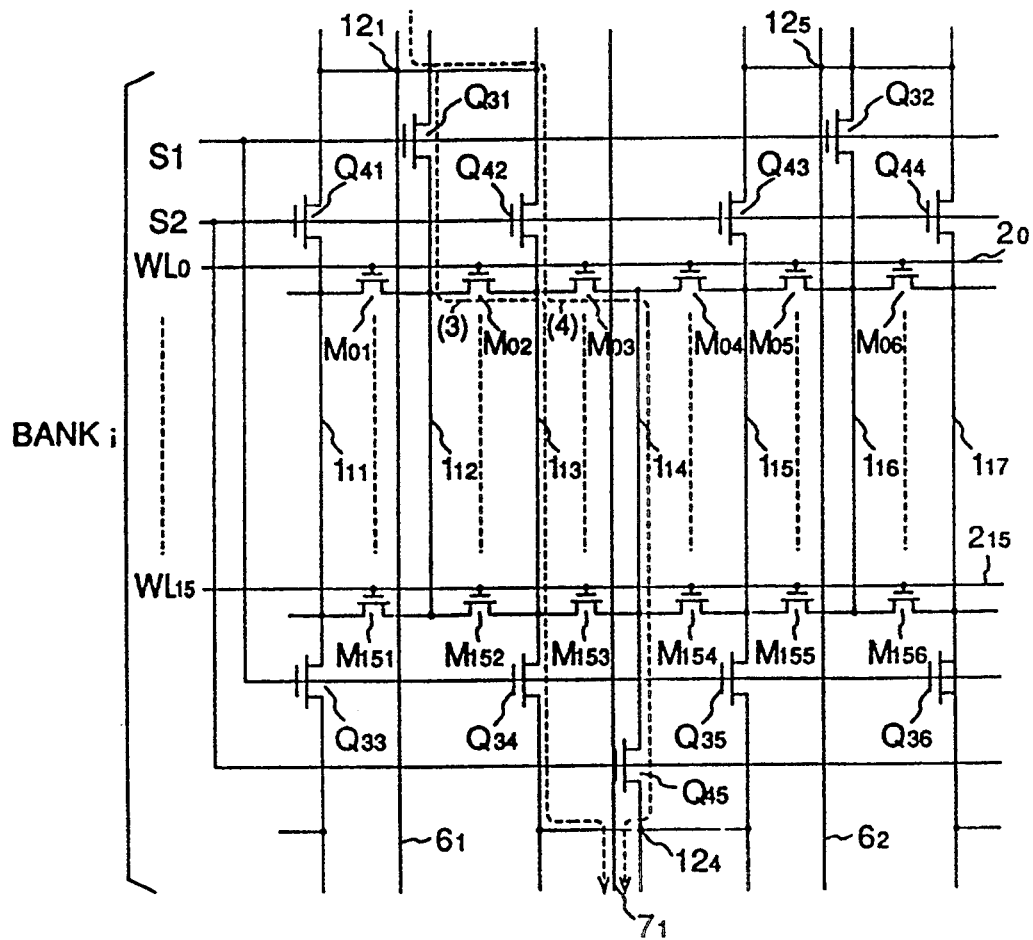
FIG. 5 is a circuit diagram showing an equivalent circuit of a ROM memory according to a second embodiment of the present invention.

FIG. 5 shows a second embodiment of the present invention, with those portions corresponding to portions of the circuit shown in FIG. 3 being indicated with corresponding reference numerals. Unlike the first embodiment, this second embodiment has the three bit lines arranged on the upper and lower sides of the selector lines 1 and 2, at the upper connection points $12_1$, $12_5$, ... of the main bit line $6_1$. In addition, the three bit lines are connected at the lower connection point $12_4$, ... of the virtual ground line $7_1$. Because of this, the number of points of connection of the main bit line and the virtual ground line is reduced by half.

In this second embodiment, to read the contents of the memory cell $M_{02}$ for example, the virtual ground line $7_1$ is set to the "Lo" level, the selector line S1 is set to the "Hi" level, the selector line S2 is set to the "Lo" level and the word line $WL_0$ is set to the "Hi" level. By this, the selector transistors $Q_{31}$ and $Q_{34}$ becomes on, and the gate conducts if the threshold voltage of the cell transistor $M_{02}$ which is biased by the word line $WL_0$ is low, and the read current flows along the route (3) shown in the figure.

If this is done, then the current which flows in the selected memory cell flows from the upper side to the lower side and so as shown by the routes (3) and (4) in the figure, the lengths of the current paths are equal even if the selected memory cells are different, and the sum of the resistances of the drain and source portions formed by the $N^+$ diffusion layer are always constant irrespective of the position of the memory cell. For example, if the 16 cells in the vertical direction are made one block, then the sum of the resistances of the drain and the source becomes 16 cell portions. With respect to this point, the sum of the resistances of the drain and the source portions in the first embodiment differs according to the place of the memory cell and is a maximum of a 32 cell portion.

Accordingly, in the second embodiment, when the number of memory cells of one block is the same, the influence of the parasitic resistance of the drain and the source becomes less, to the advantage of high-speed operation. In addition, the pattern of the same block is repeated to enable a high capacity and so with this method, when there are 32 cells in one block, the parasitic resistance becomes the same as when there were 16 cells per one block as in the first embodiment, while if 32 cells are made one block, it is possible for the average memory cell size to be made smaller. In addition, this is advantageous for high-speed operation since the number of contact portions of bit lines is reduced.

Figure 6:
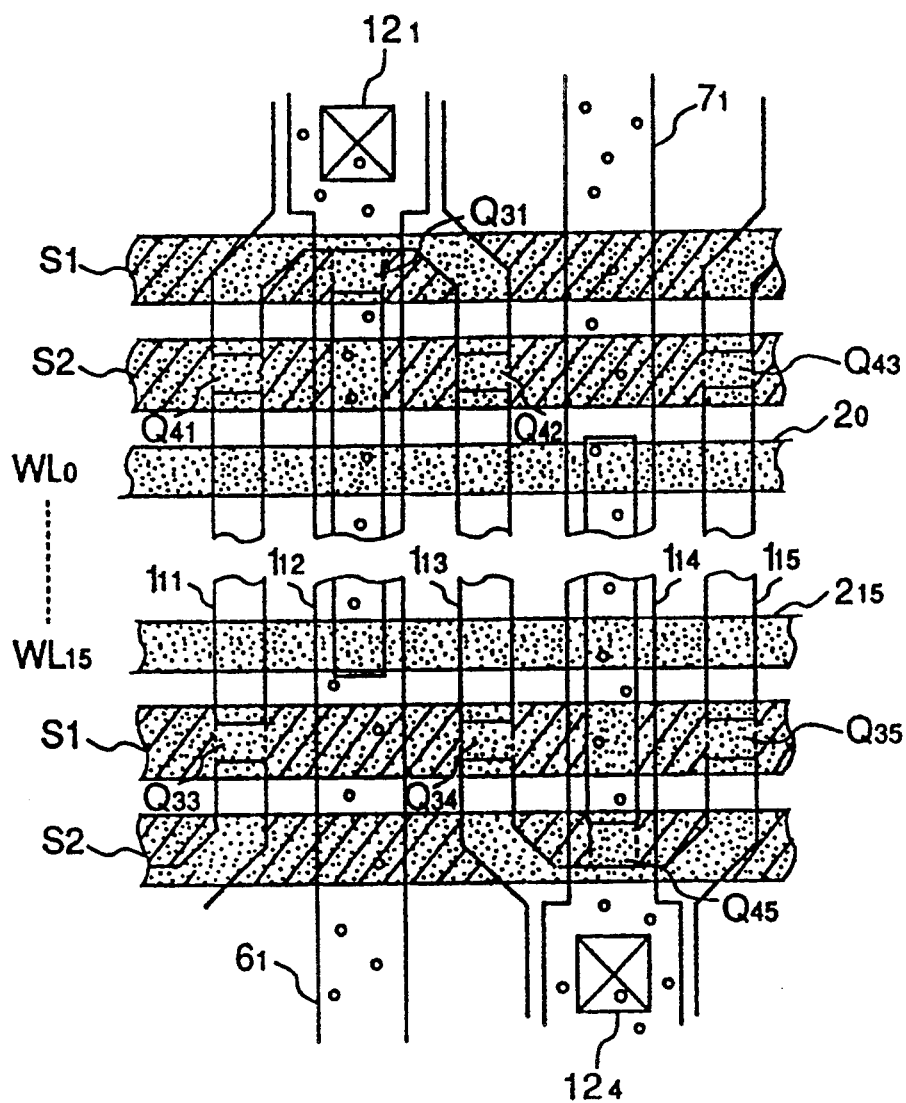
FIG. 6 is a plane view showing an example of the wiring structure of a memory cell region for the case when the equivalent circuit according to a second embodiment and shown in FIG. 5 is formed as an IC circuit.

FIG. 6 shows a plan view of a memory cell for the case when the second embodiment is formed as an IC circuit, with those portions which correspond to portions of the circuit shown in FIG. 5 being indicated with corresponding reference numerals. In FIG. 6, three bit lines $1_{11}$, $1_{12}$ and $1_{13}$ and a main bit line $6_1$ are connected by a contact hole $12_1$, and three bit lines $1_{13}$, $1_{14}$ and $1_{15}$ and a virtual ground line $7_1$ are connected by a contact hole $12_4$. In addition, only one end of the bit line $1_{12}$ is connected by the bit lines $1_{11}$ and $1_{13}$ via a transistor $Q_{31}$ and only one end of the bit line $1_{14}$ is connected by a bit lines $1_{13}$ and $1_{15}$ via a transistor $Q_{45}$. By this, it can be seen that the number of contact holes is reduced.

In this second embodiment, a selector lines S1 and S2 are formed by the channel cut region shown shaded in the figure.

Figure 7:
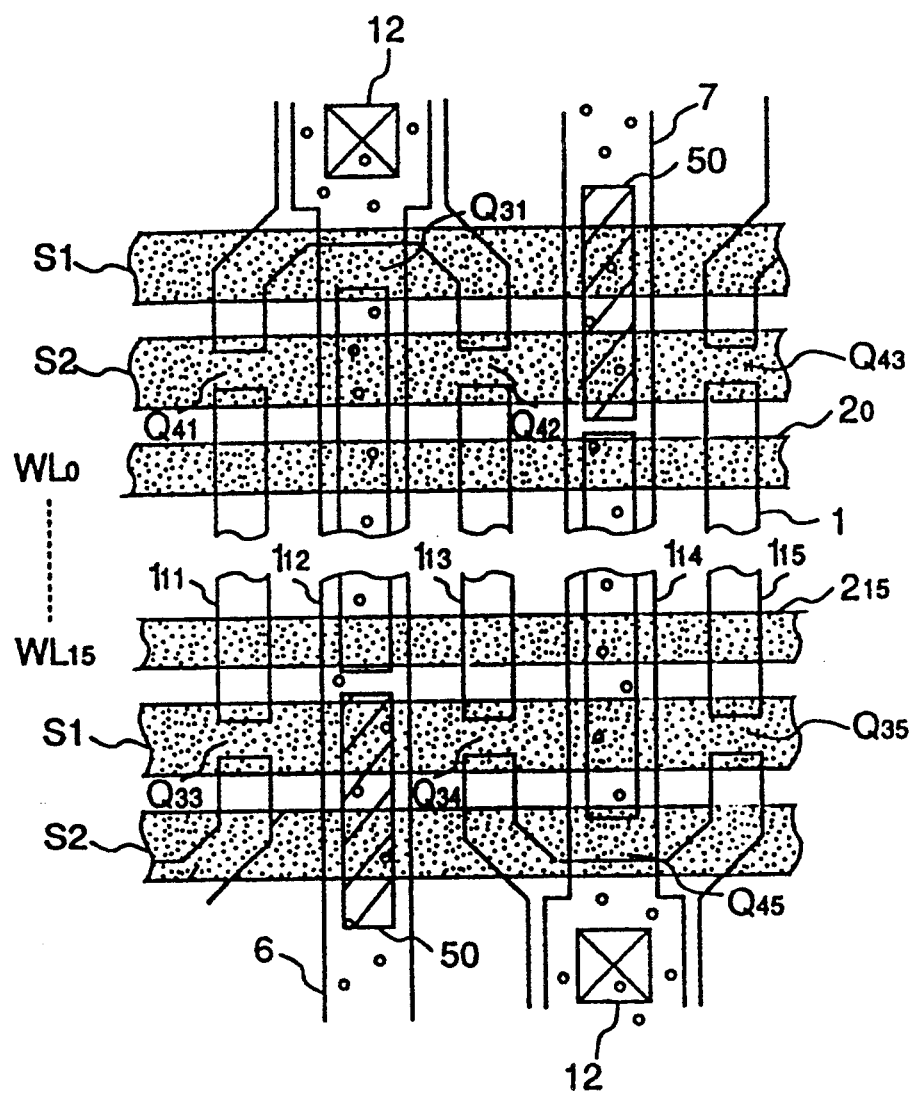
FIG. 7 is a plane view showing a wiring structure of a memory cell region of a third embodiment which is an improvement of the second embodiment.

FIG. 7 shows a third embodiment, with those portions which correspond to portions of the circuit shown in FIG. 6 being indicated with corresponding reference numerals. Unlike the second embodiment, this third embodiment has the size of a channel cut region 50 reduced to the necessary minimum. If this is done, then the channel region of the transistor can be made larger and the cell current made favorably larger.

Figure 8:
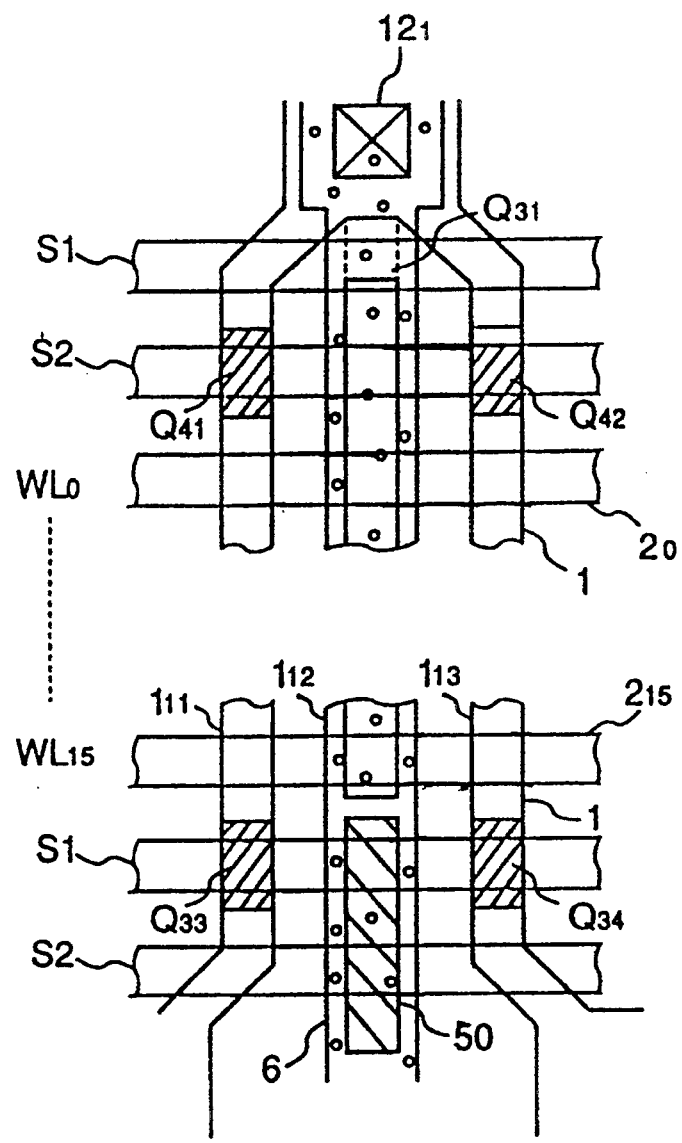
FIG. 8 is a plane view showing a wiring structure of a memory cell region of a fourth embodiment which is an improvement of the third embodiment.

FIG. 8 shows a fourth embodiment of the present invention, with those portions which correspond to portions of the circuit shown in FIG. 7 being indicated with corresponding reference numerals. In this fourth embodiment, the configuration is such that the sources and drains of selector transistors $Q_{41}$, $Q_{42}$, ... under a second selector line S2 from the top, and selector transistors $Q_{33}$, $Q_{34}$ under the second selector line S1 from the bottom form an LDD (lightly doped drain) structure.

Figure 9:
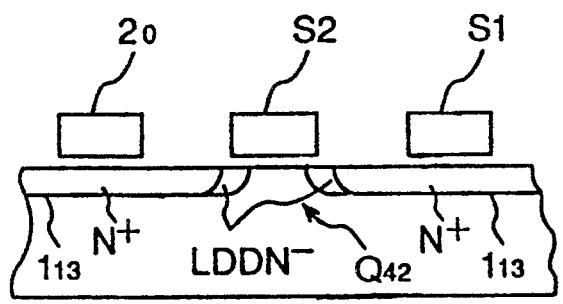
FIG. 9 is a sectional view showing a structure of a selector transistor $Q_{42}$.

FIG. 9 is a sectional view through the up-down direction of the transistor $Q_{42}$ having a LDD structure, where a bit line $1_{13}$ formed by the $N^+$ diffusion is the source and drain of the transistor $Q_{42}$, while a selector line S2 formed by polysilicon forms a gate. First, after the formation of the $N^+$ diffusion layer, there is the formation of an $N^-$ diffusion layer by a cell alignment process which uses the polysilicon gate as a mask. The process for the LDD $N^-$ uses a process for the formation of a peripheral circuit to the memory circuit and therefore the selector circuit described above can be made an LDD structure. By this, it is possible to shorten the channel length and reduce the size of the selector transistor, and to also enable the vertical direction of the circuit pattern to be made shorter. Moreover, in the first embodiment described above, the description was given for the case when the word line uses a first-layer polysilicon, but it is possible to have a structure where a first-layer polysilicon and the second layer polysilicon are alternately arranged. If this configuration is used, then it is possible to enable even higher speeds.

As described above, the use of a configuration where an $N^+$ diffusion layer where one end is electrically connected to a main bit line and another end is electrically connected to a virtual ground line, enables the main bit lines and the virtual ground lines to be arranged in straight lines, and thereby eliminate the single cell displacement of memory cells which is the case in a conventional configuration.

What is claimed is:

1. A read only memory (ROM) provided with a basic storage region forming a basic unit, said basic storage region comprising:
   a plural number of bit lines which are repeatedly arranged in single unit groups of four parallel bit lines each;
   a plural number of word lines-which are arranged so as to intersect said bit lines;
   a memory cell transistor group having intersections of said bit lines and said word lines being made source regions and drain regions of a plurality of memory cell transistors in said memory cell transistor group, and portions between said intersections being made channel regions for said memory cell transistors;
   a plural number of main bit lines, with each of said main bit lines connected to one end of a second bit line of a respective one of said single unit groups via a transistor and connected to an end on a forward direction side of a first and third bit lines of each said respective one of the single unit groups via transistors, and said main bit lines being arranged in a direction of said bit lines; and
   a plural number of virtual ground lines, with each of said virtual ground lines connected to one end of a fourth bit line of each said respective one of the single unit groups and connected to an end on a reverse direction side of said third bit line of each said respective single unit group, and connected to an end of a reverse direction side of said first bit line of a next unit group via a transistor.

2. The ROM according to claim 1, wherein said plural number of bit lines are formed by an N+ diffusion layer.

3. The ROM according to claim 1,
wherein said ROM is provided with one bank comprising a constant number of said word lines arranged in a plural number of rows and parallel to one direction;
a required number of said memory cell transistors being connected to said constant number of word lines, and the required number of memory cell transistors being arranged parallel to a direction which intersects said constant number of word lines; and
said plural number of bit lines are arranged in a required number parallel to the direction which intersects said word lines, and between each column of said memory cell transistors in said intersecting direction;
each bank being provided with a first and a second selector line for a supply of a selector current for selecting a column of said memory cell transistors.

4. The ROM according to claim 3,
wherein said first and second selector lines are arranged so as to be positioned on an outermost side of a word line and parallel to a plural number of word lines of each bank.

5. The ROM according to claim 4,
wherein said first and second selector lines are provided with a plural number of transistors at arbitrary intersections between said plural number of bit lines and said first and second selector lines as gates of said plural number of transistors to allow a read current to flow via a first virtual ground line, and a single main bit line is connected so as to select memory cell transistors of four columns in a direction intersecting said first and second selector lines.

6. The ROM according to claim 5,
wherein said virtual ground line is connected so as to supply a read current to memory cell transistors of the four columns of a first column, a second column, third column and fourth column, and in which a read current is supplied to memory cell transistors of a first group of said second column and third column via a first selector line from one direction and a read current is supplied to memory cell transistors of a second group of said first column and fourth column from another direction.

7. The ROM according to claim 3,
wherein said first and second selector lines are arranged so as to be positioned on an outermost side of a word line and parallel to a plural number of word lines of each bank, with said selector lines being branched so as to be connected in parallel and arranged on both sides of a bank, to form a pair.

8. The ROM according to claim 7,
wherein said first and second selector lines are provided with a plural number of transistors at arbitrary intersections between said plural number of bit lines and said first and second selector lines as of said plural number of transistors to allow a read current to flow via a first virtual ground line, and a single main bit line is connected so as to select memory cell transistors of four columns in a direction intersecting said first and second selector lines.

9. The ROM according to claim 7,
wherein said virtual ground line is connected so as to supply a read current to memory cell transistors of the four columns of a first column, a second column, third column and fourth column, and in which a read current is supplied to memory cell transistors of a first group of said second column and third column via said first selector line from one direction, and a read current is supplied to memory cell transistors of a second group of said first column and fourth column from another direction.

* * * * *